United States Patent
Hautier et al.

(10) Patent No.: US 6,769,621 B2
(45) Date of Patent: Aug. 3, 2004

(54) PACK PROVIDED WITH AN ANTENNA EXTENSION FOR ELECTRONIC CARD AND METHOD FOR THE ASSEMBLING OF THE PACK

(75) Inventors: Frédéric Hautier, Besancon (FR); Laurent Saillard, Pouilley les Vignes (FR)

(73) Assignee: FCI, Paris (FR)

( * ) Notice: Subject to any disclaimer, the term of this patent is extended or adjusted under 35 U.S.C. 154(b) by 0 days.

(21) Appl. No.: 10/332,825

(22) PCT Filed: Jul. 18, 2001

(86) PCT No.: PCT/EP01/09337

§ 371 (c)(1),
(2), (4) Date: Jun. 2, 2003

(87) PCT Pub. No.: WO02/07489

PCT Pub. Date: Jan. 24, 2002

(65) Prior Publication Data

US 2004/0008502 A1 Jan. 15, 2004

(30) Foreign Application Priority Data

Jul. 19, 2000 (FR) .......................................... 00 09504

(51) Int. Cl.[7] .............................................. G06K 19/06
(52) U.S. Cl. ...................................................... 235/492
(58) Field of Search ................................. 235/487, 492; 361/737

(56) References Cited

U.S. PATENT DOCUMENTS

| | | | |
|---|---|---|---|
| 5,373,149 A | | 12/1994 | Rasmussen ................. 235/492 |
| 5,463,531 A | * | 10/1995 | Choon et al. ................ 361/737 |
| 5,513,074 A | | 4/1996 | Ainsbury et al. ........... 361/737 |
| 5,754,404 A | * | 5/1998 | Biermann et al. .......... 361/737 |
| 6,018,461 A | | 1/2000 | Biermann et al. .......... 361/737 |
| 6,324,076 B1 | * | 11/2001 | Gerrits et al. ............... 361/818 |
| 6,527,188 B1 | * | 3/2003 | Shobara et al. ............. 235/486 |
| 6,533,177 B1 | * | 3/2003 | Gerrits et al. ............... 235/487 |

FOREIGN PATENT DOCUMENTS

| | | |
|---|---|---|
| DE | 19710515 C1 | 8/1998 |
| DE | 29906052 U1 | 9/1999 |
| EP | 0864998 A2 | 9/1998 |
| WO | WO 98/20451 | 5/1998 |
| WO | WO 99/14993 | 3/1999 |

* cited by examiner

*Primary Examiner*—Karl D. Frech
*Assistant Examiner*—April Taylor
(74) *Attorney, Agent, or Firm*—Perman & Green, LLP

(57) ABSTRACT

Pack provided with an antenna extension for electronic cards, the antenna extension module being made of plastic materials and fixedly joined to an external shielding of this electronic card by a device comprising two arms irreversibly held on at least one of the shielding shells of the pack. The two shielding shells are then irreversibly joined together by means of projecting blades and notches of the borders of these shells, force-fitted to each other. This pack is preferably designed to receive a PCMCIA type card.

12 Claims, 2 Drawing Sheets

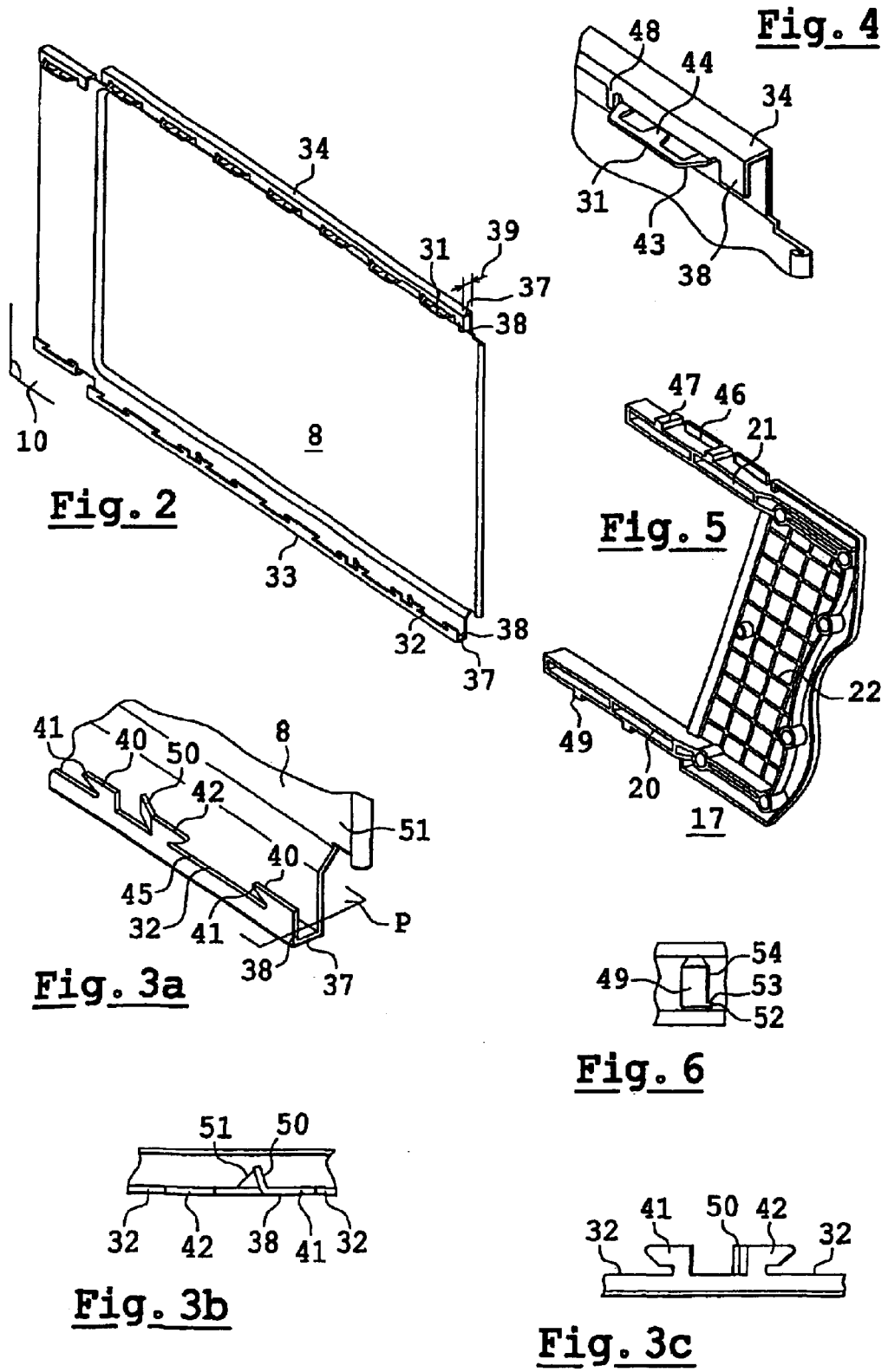

PACK PROVIDED WITH AN ANTENNA EXTENSION FOR ELECTRONIC CARD AND METHOD FOR THE ASSEMBLING OF THE PACK

This application claims the benefit of the earlier filed International Application No. PCT/EP01/09337, International Filing Date, Jul. 18, 2001, which designated the United States of America, and which international application was published under PCT Article 21(2) as WO Publication No. WO 02/07489 A1.

BACKGROUND OF THE INVENTION

1. Field of the Invention

An object of the present invention is a pack provided with an antenna extension for electronic cards. An object of the invention is also a method for the assembling of such a pack. It can be used more particularly in the field of packs designed to contain cards meeting the criteria fixed by the PCMCIA (Personal Computer Memory Card International Association) standard. Electronic cards of this kind are widely used, especially to add memory capacities and/or functions to a computer and more particularly to portable computers. These cards are present in packs provided with a connector at their front end. This end meets precise dimensional criteria.

2. Brief Description of Related Developments

In the prior art, it is sought, by means of such cards, to provide for a plurality of additional functions. In general, to combine several functions within a card of this kind, it is necessary, given the strict criteria imposed on card formats and pack formats, to connect an extension module to a rear part of the pack. The value of the invention is that it proposes a single-block pack complying with PCMCIA standards, and comprising both a shielded pack and an unshielded antenna extension.

In the prior art, there is a known electronic card provided with a pack. The pack has two metal shells positioned on either side of the card and directly fixed to each other without the use of a mounting frame. In particular, the document WO 98/20451 teaches the use of a pack comprising shells such that these shells have a front end to present a connector and two borders perpendicular at this front end. The borders of the shells have shoulders, the shoulder corresponding to an approximately 90° fold of one plane of the metal shell. These shoulders furthermore have projecting blades and complementary notches for these blades. The shells are designed in such a way that the planes of the two shells are positioned in parallel and a notch of a shoulder of a first shell is positioned facing a projecting shoulder of the second shell. The projecting blades get fitted into the notches irreversibly because the non-return devices of the blades abut the edges of the notches.

The card mounted between the two metal shells is then shielded irreversibly. However, when an RF application is desired, it is necessary that an antenna extension should not be contained between these two shielded shells. To this end, the prior art, especially the document WO-A-99/14993, teaches the assembly of a second unshielded pack on the first pack. To this end, the second pack has a specific connector to be connected to a complementary connector presented at the level of a rear end of the first pack. Indeed, since the front end and the borders perpendicular to this first end have to comply with the PCMCIA card standards, the complementary connector can only be placed at the rear end.

This prior art approach is costly because it requires the positioning of a set of two complementary connectors to provide for a link between the first pack and the second pack used as an antenna extension module. Furthermore, this approach makes it necessary to provide for means to hold this second pack on the first pack of the electronic card, to prevent disconnection. Therefore, this system is cumbersome.

The teaching of the document U.S. Pat. No. 5,373,149 describes a known pack for electronic cards provided with an antenna extension. This antenna extension is connected by a flexible printed circuit to the electronic card of the pack. The antenna extension module, according to this teaching, is connected to a first section by a hinge. This hinge lets through the printed circuit. The hinge places the extension module in variable positions with respect to the first section. For example the extension module may be positioned at 90° with respect to the first pack.

The use of a hinged system of this kind to connect an extension module is fragile. Indeed, there is a risk that the flexible printed circuit contained in this hinge may be damaged by being gripped. Furthermore, there is the risk that clumsy handing of the antenna extension with respect to the first pack might quite simply break this hinge.

The document U.S. Pat. No. 5,513,074 describes a known first pack comprising an electronic card having, at a first end, a connector that meets PCMCIA criteria and, at a second end opposite this first end, a second connector to be connected with a complementary connector of an extension module, for example an antenna extension module. This extension module has means of latching on to the pack and the latching means are designed to be inserted into the pack when it is totally closed. Indeed, the module according to the device is designed so that it can be detachably mounted. The means designed on either side of the complementary connector are therefore force-fitted into recesses designed for this purpose on the pack. This force-fitting corresponds to the fitting-in of a ridge into a channel or vice versa.

This last-named solution of the prior art raises a problem. It is costly because it requires the positioning of two complementary connectors to link the first pack to the extension module. Secondly, this approach does not provide for a solid and sure connection. When the PCMCIA pack is inserted, for example, into the connection port of a computer, then the way to withdraw the card is to pull on the rear end of the pack. In the present case, the tensile force is therefore exerted on the extension module. If the extension module is not solidly held, which is the case in the prior art, there is a risk that the exertion of the tensile force will cause the release of extension module of the pack and not the disconnection of this pack from the port of the computer.

The prior art solutions are fragile and costly, firstly because they require high precision means to set up a suitable connection between the extension module and the pack containing the electronic card. Secondly, these approaches generally lead to proposing an extension module with a thickness greater than that of the pack containing the electronic card.

It is an object of the invention to overcome the problems cited by proposing a pack containing an electronic card provided with an extension module such that the extension module is fixedly joined to the pack containing the electronic card, this extension module forming an integral part of the pack when it is closed. Indeed, the solution of the invention provides for the association, before the mounting of the electronic card in the pack, of the shielded shells of the pack with protective shells of the extension module. The electronic card is then mounted so as to be sandwiched between these two combined shells thus obtained. Indeed, the invention consists of a pack provided with a shielded lower shell on which a lower extension lid is mounted and, secondly, an upper shielded shell that is itself designed to be connected to an upper extension lid.

SUMMARY OF THE INVENTION

During the assembly, the upper extension lid is designed to be positioned so as to face the lower extension lid. The mounting of a lid on a shell is irreversible just as the joining of the two shells is also irreversible. There is therefore no longer any need for a connector between the module card and the extension module.

The mounting of the lower plastic lid on the lower shielded shell is achieved by fitting in along a direction orthogonal to a plane of extension of the shielded shell. To this end, when the electronic card is inserted in the lower shielded shell and when the upper shielded is mounted irreversibly in the lower shielded shell, then the extension lids are themselves held irreversibly to the pack. A tensile force exerted on the rear end in no way detaches the plastic lids from the shielded shell. Indeed, elastic tongues positioned on at least one shoulder of a shielded shell abut the lateral projections on either side of at least one of these plastic lids.

In a preferred example, the electronic card comprises a portion extending between the two extension lids. Then, the extension module is constituted by this portion of the electronic card. A particular use of the invention is to propose an antenna extension module comprising lids made of plastic materials permitting the passage of RF waves while the shielded shell protects the card from the electromagnetic fields.

An object of the invention is a pack comprising a lower shielded shell, an upper shielded shell and an electronic card positioned between the shielded shells, the shielded shell being provided with projecting blades and notches, the notches of a first shell being designed to receive respectively the blades of a second shell, characterised in that it comprises an extension module of the card and extension lids positioned on either side of the extension module, an extension lid comprising two arms held in a shielded shell, one of the two arms being inserted perpendicularly into a plane of this shell and mounted parallel to this plane.

An object of the invention is a method for the assembling of a pack comprising the following steps:

a lower extension lid is mounted on a lower shielded shell by inserting arms of this lid into means of this lower shielded shell in such a way that the arms are driven perpendicularly into the bottom of the shell in the means;

an electronic card is fixed in the lower shell;

an upper extension lid is connected with the lower extension lid in such a way that an extension module of the card is positioned between the two lids;

an upper shielded shell is mounted above the lower shielded shell in such a way that notches and projecting blades of the borders of the lower shell are irreversibly joined, respectively, with projecting blades and notches of the borders facing the upper shell.

BRIEF DESCRIPTION OF THE DRAWINGS

The invention will be understood more clearly from the following description and the appended figures. These figures are given purely by way of an indication and in no way restrict the scope of the invention. Of these figures:

FIG. 2 shows a view in perspective of a shielded shell of a pack according to the invention;

FIG. 3a shows an enlargement of a perspective view of a portion of FIG. 2;

FIG. 3b shows a sectional view of a portion of FIG. 3a along a sectional plane P shown in FIG. 3a;

FIG. 3c shows a top view of the portion shown in FIG. 3a;

FIG. 4 shows an enlargement of a view in perspective of a second portion of FIG. 2;

FIG. 5 shows a view in perspective of an extension lid of a pack according to the invention;

FIG. 6 shows a view in profile of a portion of the lid shown in FIG. 5.

DETAILED DESCRIPTION OF THE PREFERRED EMBODIMENT(s)

Figure 1:
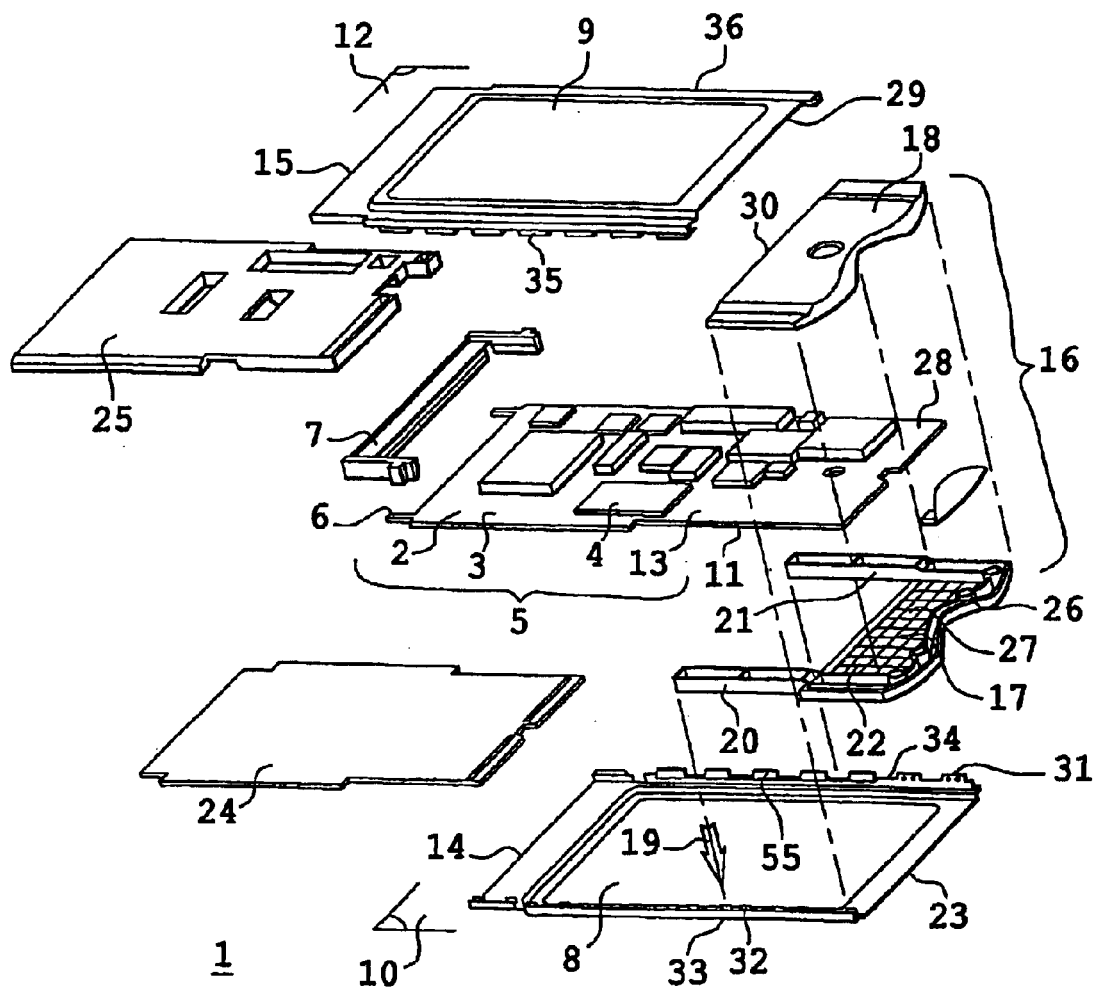
FIG. 1 shows an exploded view of a pack provided with an antenna extension for an electronic card according to the invention.

FIG. 1 shows a pack 1 according to the invention. The pack 1 has an electronic card 2. The electronic card 2 has a flat and rigid substrate. The card 2 forms a plane 3, one level of which has electronic components 4 and conductive tracks connecting the components 4 to one another. The electronic card 2 is preferably a PCMCIA card. To this end, the card 2 complies with the conditions of width and thickness at least in a front part 5. At the level of this front part 5, the card 2 has a front face 6 designed to be connected with a connector 7. The connector 7 is an interface used to connect the card 2 to a complementary connector of the connector 7. For example, this complementary connector is on a computer.

The pack 1 has a lower shielded shell 8 and an upper shielded shell 9. Together, these shells 8 and 9 are designed to form a hermetically sealed pack around the card 2 and preferably around the front portion 5 of this card 2. A plane 10 formed by the lower shielded pack is positioned in parallel to the plane 3 against a lower face 11 of this card 2. Similarly, the upper shielded shell 9 forms a plane 12 such that the upper shell 9 is positioned against an upper face 13 of the card 2 in such a way that the plane 12 is parallel to the plane 3 and the plane 10.

The lower shielded shell 8 has a front face 14 and, respectively, the upper shell 9 has a front face 15 such that, when the shells are assembled, a recess is formed between these two shells. This shell is used to present at least one contact pin of the connector 7.

In a preferred embodiment, the lower shielded shell 8 and the upper shielded shell 9 are identical moldings of a metal plate, for example made of stainless steel. This plate for example is 0.2 mm thick.

The pack 1 also has an extension module 16. This extension module 16 is preferably an antenna extension module. The extension module 16 has a lower extension lid 17 and an upper extension lid 18. The lower extension lid 17 is designed to be mounted on the lower shell 8 in a direction of assembly 19. This direction of assembly 19 is only orthogonal to the plane 10 (the precise mounting is described hereinafter). The lower extension lid 17 is mounted on the lower shell 8 before the card 2 is placed in this lower shell 8. The upper lid 17 has two arms 20 and 21 held in the lower shell 8. A portion 22 of the lower shell 17 extends in the prolongation of the lower shell 8 in parallel to the plane 10.

The lower shell 8 has a flexure 23 oriented perpendicularly to the plane 10 designed to be inserted in a complementary relief of the portion 22.

The lower shell 8 joined to the lower lid 17 may possibly receive a reinforcement plate 24 positioned in parallel to the plane 10 in such a way that the card 2 mounted in the lower shell 8 is not directly in contact with this shell 8. Indeed, the reinforcement plate 24 is preferably made of plastic to protect the card 2 from possible short circuits. Secondly, this reinforcement plate 24 is used to strengthen the structure of the lower shielded shell 8 which has a small thickness and may therefore be subjected to curvatures.

When the card 2 is thus mounted, it is also possible to plan for a second reinforcement plate 25 to be mounted against the upper face 13 of the card 2. This reinforcement plate 25 also protects the card 2 from short circuits with the upper shielded shell 9.

However, before mounting the upper shielded shell 9 irreversibly with the lower shielded shell 8, the upper lid 18 is mounted on the lower lid 17. For example, pins going beyond the upper lid 18 are pressed into the apertures 26 on a bottom 27 of the portion 22. The upper lid 18 is force-fitted on the portion 22 of the lower lid 17. In a preferred example, the upper lid 18 has no arms facing the arms 20 and 21.

In the context of the use of the extension module 16 for an antenna extension, the lids 17 and 18 are made of plastic. An antenna may be positioned between these two lids and then connected to the card 2. In one variant, as shown in FIG. 1, the antenna may be directly placed on a zone 28 of the card 2, this zone 28 being positioned between the lids 17 and 18 while the card 2 is positioned between the shielded shells 8 and 9.

To finish the mounting of the pack 1 according to the invention, the upper shell 9 is mounted facing the lower shell 8 in such a way that a flexure 29, such as 23, of the upper shell 9 gets fitted into a complementary relief 30 of the upper lid 18.

Furthermore, the lower shell 8 has blades 31 and notches 32 positioned on the borders 33 and 34 of this lower shell 8, these borders 33 and 34 being perpendicular to the front face 14 and the rear flexure 23. Similarly, the upper shielded shell 9 has a first border 35 to be positioned facing the border 33 and a second border 36 to be positioned facing the border 34.

In a preferred embodiment, where the upper shielded shell 9 is identical to the lower shielded shell 8, the first border 35 corresponds to the border 34 and the second border 36 corresponds to the border 33. Hence, the upper shell 9 also has projecting blades and notches, these blades and notches being positioned in such a way that a projecting blade of the upper shell 9 is positioned so as to be facing a notch of the lower shell 8 and conversely a notch of the upper shell 9 is positioned so as to be facing a projecting blade of the lower shell 8.

FIG. 2 shows a preferred exemplary embodiment of a lower shielded shell 8. This shell is identical to the upper shielded shell 9 with which it has to be connected. In this example, the border 34 has only projecting blades such as 31 and the border 33 has only notches such as 32. On one and the same shell, each notch 32 of the border 33 is presented so as to be facing a projecting blade 31 of the border 34. The borders are designed in such a way that, on a sufficient length, notches 32 and blades 31 respectively are spaced out periodically for example at intervals of 3 mm. In this example, the borders have eight notches 32 and eight blades 31 respectively.

The borders 33 and 34 are designed in the same way and have a flexure 37. This flexure 37 is perpendicular to the plane 10. The flexure 37 also has an turn-up 38 oriented towards the interior of the shell parallel to the plane 10. The flexure 37 has a thickness 39.

Notches such as 32 are defined in the plane formed for the turn-up 38. They correspond to a cut in this turn-up 38. However, the projecting blades 31 correspond to a pre-cut pattern in the turn-up 38. This pattern is prepared perpendicularly to the turn-up 38. The projecting blades 31 are therefore perpendicular to the plane 10 and oriented towards the upper shell 9 to be connected with the lower shell 8. These projecting blades 31 have a height lower than or equal to the thickness 39 of the flexure 37.

FIG. 3a shows a notch 32 corresponding to a dip in the turn-up 38 at an inner edge 40 of this turn-up 38 such that the notch 32 has a width greater than an aperture at the edge 40. Indeed, the notch 32 is demarcated by strips 41 and 42 of the edge 40 on either side of the notch 32. The turn-up 38 is designed in such a way that the strip 42 of a first notch is joined, along a structure positioned in the extension of the edge 40, to a strip 41 of a following notch 32.

A projecting blade 31 has a shape designed to be inserted by force into a notch 32. Furthermore, the blade 31 has an elastic tongue 44 designed to work together with a border 45 of the flexure 32. This border 45 is demarcated between the strips 41 and 42. These strips 41 and 42 are positioned on a lower side of the shell facing the projecting blade 31 while the border 45 is positioned on an external side of the shell facing this blade.

A first arm 21 of the lower lid 17 is designed to be mounted in the border 34. To this end, the arm 21 has an external ridge 46 designed to be positioned beneath the turn-up 38 of the border 34. In a preferred example, the arm 21 has two ridges such as 46 spaced out with respect to one another and located in the same plane. Secondly, this arm 21 has a ledge 47 positioned orthogonally to the ridge 46. The ledge 47 is designed to be held by a flexure 48 of the turn-up 38 of the border 34. The cooperation of the ridge 46 and the ledge 47 with the turn-up 38 of the border 34 enable a unique positioning of this arm 21 in the border 34. Preferably, this arm 21 is inserted obliquely into this border 34.

Then, the second arm 20 of the lower lid 17 is lowered towards the border 33 of the lower shielded shell 8. The arm 20 has a pin 49 such that this pin 49 is designed to be blocked between a strip 42 of a first notch 32 and a strip 41 of a following notch 32. Indeed, as shown in FIGS. 3a, 3b, and 3c, the portion between a strip 42 of this kind and a next strip 41 comprises an elastic tongue 50 and does not have an edge in the extension of the edge of the strips, as is the case for the zones of the border 33 which are not designed to receive the arm 20. This elastic tongue 50 is oriented in a direction generally opposite the direction pointing to a rear part 51 of the lower shielded shell 8. Thus, the elastic tongue 50 is used to hold the arm 20 in the border 33 of the lower shell 8.

This elastic tongue 50 holds the pin 49. Indeed, this pin 49 has a lateral flexure 52 to work together with the elastic tongue 50. This lateral flexure 52 has a width 53 with respect to a flank 54 of the pin 49. This width 53 is preferably in the range of 0.2 mm. In the preferred example, the elastic tongue 50 forms an angle 51 with an upper surface 52 of the turn-up 38. This angle 51 is preferably about 75°.

Once the pin 49 is inserted into the aperture formed by the strips 41 and 42 and once the lateral flexure 52 has been held by the elastic tongue 50, the arm 20 is mounted and irreversibly clipped into the border 33. Thus, the lower extension lid 17 is mounted as described irreversibly on the lower shielded shell 8. Its dismantling is destructive and thus provides for the solidity and irreversibility of the connection of the extension module 16 with the pack formed by the shells 8 and 9.

In one variant, external walls of the extension lids 17 and 18 belong respectively to the planes 10 and 12 of the external faces of the lower shell 8 and the upper shell 9 respectively.

Furthermore, in another example, the pack 1 will comprise, as shown in FIG. 1, a reinforcing bar 55 to reinforce and ensure the holding of projecting blades 31. This bar 55 prevents the projecting blades 231 from being crushed or from crushing each other when the blades 31 are fitted into the notches 32.

What is claimed is:

1. A pack (1) comprising a lower shielded shell (8), an upper shielded shell (9) and an electronic card (2) positioned between the shielded shells, the shielded shell being provided with projecting blades (31) and notches (32), the notches of a first shell being designed to receive respectively the blades of a second shell, characterized in that the pack includes an extension module (16) of the card and extension lids (17, 18) positioned on either side of the extension module, an extension lid comprising two arms (20, 21) held in a shielded shell, one of the two arms being inserted perpendicularly into a plane of this shell and mounted parallel to this plane.

2. The pack according to the claim 1, characterized in that a first arm (21) comprises a ridge (46) caught beneath a channel (38) of a first side (34) of the lower shielded shell.

3. The pack according to the claim 2, characterized in that the channel is surmounted by projecting blades and in that this first side preferably has only projecting blades.

4. The pack according to claim 1, characterized in that the first arm has a ledge orthogonal (47) to the ridge, the ledge getting fitted into a recess (48) of the first side.

5. The pack according to claim 1, characterized in that a second arm (20) has a pin (49) provided with a lateral flexure (52), the pin being introduced into an aperture (41, 42) of a second side (33) of the pack, and the lateral flexure working together with an elastic tongue (50) of this aperture.

6. The pack according to the claim 5 characterized in that the second side preferably has only notches, and the aperture is made in a part of a notch.

7. The pack according to claim 1, characterized in that the extension module is designed to receive an antenna, and in that the extension lids are made of plastic.

8. The pack according to claim 1, characterized in that the extension module corresponds to a zone (28) of the electronic card.

9. A method for the assembling of a pack (1) according to claim 1, comprising the following steps:
   - a lower extension lid (17) is mounted on a lower shielded shell (8) by inserting arms (20, 21) of this lid into means (38, 48, 50) of this lower shielded shell, in such a way that the arms are driven perpendicularly into the bottom of the shell in the means;
   - an electronic card (2) is fixed in the lower shell;
   - an upper extension lid (18) is connected with the lower extension lid in such a way that an extension module (16) of the card is positioned between the two lids;
   - an upper shielded shell (9) is mounted above the lower shielded shell in such a way that notches (32) and projecting blades (31) of the borders (33, 34) of the lower shell are irreversibly joined, respectively, with projecting blades and notches of the borders facing the upper shell.

10. The method according to claim 9 characterized in that:
    - a ridge (46) of a first arm (21) of the lower extension lid is slid beneath a channel of a first side (34) of the lower shielded shell;
    - a second arm (20) of this lid is made to descend into an aperture positioned on a second side (33) of this shell;
    - the lid is placed in the shell in such a way that a lateral flexure (52) of a pin of the second arm is held by an elastic tongue (50) of the aperture.

11. The method according to claim 10, characterized in that a reinforcing plate (24, 25) is positioned between each face (11, 13) of the electronic card and each of the shielded shells respectively.

12. The method according to claim 9, characterized in that reinforcing bars (55) are placed on the projecting blades of the borders of the shielded shells before their assembly.

* * * * *